(12) United States Patent
Meyer et al.

(10) Patent No.: US 9,093,322 B2
(45) Date of Patent: Jul. 28, 2015

(54) SEMICONDUCTOR DEVICE

(75) Inventors: Thorsten Meyer, Regensburg (DE); Markus Brunnbauer, Lappersdorf (DE); Recai Sezi, Roettenbach (DE)

(73) Assignee: INTEL MOBILE COMMUNICATIONS GMBH, Neubiberg (DE)

( * ) Notice: Subject to any disclaimer, the term of this patent is extended or adjusted under 35 U.S.C. 154(b) by 1118 days.

(21) Appl. No.: 11/777,694

(22) Filed: Jul. 13, 2007

(65) Prior Publication Data

US 2009/0014871 A1    Jan. 15, 2009

(51) Int. Cl.
  *H01L 23/48*     (2006.01)
  *H01L 23/00*     (2006.01)
  *B81C 1/00*      (2006.01)
  *H01L 21/56*     (2006.01)
  *H01L 23/31*     (2006.01)

(52) U.S. Cl.
  CPC ........... *H01L 24/12* (2013.01); *B81C 1/00301* (2013.01); *H01L 21/568* (2013.01); *H01L 24/11* (2013.01); *B81B 2207/07* (2013.01); *B81B 2207/097* (2013.01); *H01L 23/3114* (2013.01); *H01L 2224/02311* (2013.01); *H01L 2224/0401* (2013.01); *H01L 2224/1132* (2013.01); *H01L 2224/1147* (2013.01); *H01L 2224/13099* (2013.01); *H01L 2924/014* (2013.01); *H01L 2924/01005* (2013.01); *H01L 2924/01006* (2013.01); *H01L 2924/01029* (2013.01); *H01L 2924/01033* (2013.01); *H01L 2924/01046* (2013.01); *H01L 2924/01047* (2013.01); *H01L 2924/01049* (2013.01); *H01L 2924/01078* (2013.01); *H01L 2924/01082* (2013.01); *H01L 2924/01322* (2013.01); *H01L 2924/14* (2013.01); *H01L 2924/1461* (2013.01); *H01L 2924/19041* (2013.01); *H01L 2924/19042* (2013.01); *H01L 2924/19043* (2013.01)

(58) Field of Classification Search
  USPC .................................... 257/779, 781
  See application file for complete search history.

(56) References Cited

U.S. PATENT DOCUMENTS

| | | | | |
|---|---|---|---|---|
| 6,157,079 | A  * | 12/2000 | Taguchi ........................ | 257/737 |
| 6,232,563 | B1 * | 5/2001  | Kim et al. .................... | 174/261 |
| 6,252,301 | B1   | 6/2001  | Gilleo et al. | |
| 6,391,678 | B1 * | 5/2002  | Paszkiet et al. .............. | 438/106 |

(Continued)

FOREIGN PATENT DOCUMENTS

| | | |
|---|---|---|
| JP | 2000188305 | 7/2000 |
| JP | 2001135742 | 5/2001 |

OTHER PUBLICATIONS

"Information About Dow Corning Brand Polymeric Interconnect Materials", Dow Corning Electronics Solutions.

*Primary Examiner* — Mark Tornow
(74) *Attorney, Agent, or Firm* — Dicke, Billig & Czaja, PLLC

(57) ABSTRACT

A semiconductor device is disclosed. One embodiment includes a semiconductor substrate and at least two insulating elements located above the semiconductor substrate or above a mold compound embedding the semiconductor substrate. The at least two insulating elements have a first face facing the semiconductor substrate or the mold compound and a second face facing away from the semiconductor substrate or the mold compound. A conductive element for each of the at least two insulating elements extends from the first face of the insulating element to the second face of the insulating element.

17 Claims, 8 Drawing Sheets

(56) References Cited

U.S. PATENT DOCUMENTS

| | | |
|---|---|---|
| 6,414,849 B1 | 7/2002 | Chiu |
| 7,176,043 B2 | 2/2007 | Haba et al. |
| 2001/0002068 A1* | 5/2001 | Farnworth et al. ............ 257/737 |
| 2002/0048924 A1* | 4/2002 | Lay et al. ...................... 438/613 |
| 2005/0026413 A1* | 2/2005 | Lee et al. ...................... 438/612 |
| 2005/0073029 A1* | 4/2005 | Chua et al. .................... 257/620 |
| 2006/0138647 A1 | 6/2006 | Crisp et al. |
| 2006/0278982 A1* | 12/2006 | Solo De Zaldivar .......... 257/737 |

* cited by examiner

A)

B)

C)

A)

B)

C)

D)

E)

SEMICONDUCTOR DEVICE

BACKGROUND

The invention relates to a semiconductor device.

Recently, the concept of soldering semiconductor substrates directly onto a mounting platform such as e.g., a printed circuit board (PCB) has become popular because of its potential to reduce cost and size of the device. A major challenge in the related art is the need of stress compensation between the semiconductor substrate and the mounting platform. Typically, the semiconductor substrate and the mounting platform have different thermal expansion properties which cause the development of stress at the connections (typically solder bumps) between these two parts. As a result, especially in the case of larger semiconductor substrates, warpage may occur and can be the cause of solder bump cracks or other fatal defects.

A number of counter measures are known. In some cases, a mounting platform having a thermal expansion which better matches to the thermal expansion of the semiconductor substrate may be used. Further, an underfill material may be applied between the semiconductor substrate and the mounting platform and acts as a stress absorbing interlayer. Another possibility is to counter the occurrence of shear forces by the use of solder bumps having improved resilience or crack resistance.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In the following, a semiconductor or a semiconductor substrate may be a chip which may include an integrated circuit such as a logic circuit, a power circuit, an analog circuit, an electro-optical device, a micro-electro-mechanical system (MEMS) etc. The semiconductor substrate may also be a wafer prior to separating the wafer into single chips. In many cases, the semiconductor substrate will be made of silicon. However, any other semiconductor materials such as for instance compound semiconductors (e.g., gallium arsenide or indium phosphite) are equally possible.

A semiconductor device including the semiconductor substrate equipped with conductive resilient interconnect posts or a hollow resilient interconnect structure is designed to be attached to a mounting platform. The mounting platform may be an application board or PCB, on which the semiconductor device can be directly mounted. However, the mounting platform may equally be an alternative type of substrate such as a sequential build-up (SBU) laminate substrate, a ceramic substrate or a molded substrate such as a molded interconnect device (MID) made of plastic. Moreover, it is possible that the semiconductor substrate is mounted on another semiconductor substrate used as a mounting platform, thus forming stacked semiconductor devices.

Figure 1:
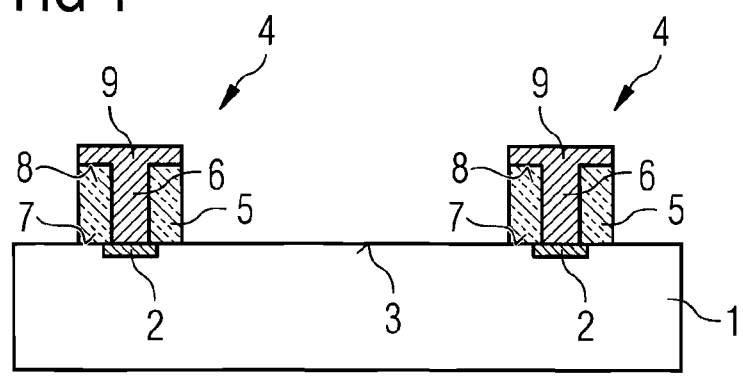
FIG. 1 illustrates a cross-sectional view of a semiconductor substrate including conductive interconnect posts.

FIG. 1 illustrates a semiconductor device having a semiconductor die or chip 1. Chip pads 2 are formed at an active surface 3 of chip 1. The chip pads 2 represent the electrical terminals of the chip 1 and are connected to active functional elements (e.g., transistors, electro-optical or electromechanical elements, etc. not illustrated in FIG. 1) by a chip-internal wiring (also not illustrated).

The chip pads 2 are electrically connected to resilient, stand-alone and spaced-apart conductive posts 4 projecting substantially in a perpendicular direction away from the active surface 3 of the chip 1.

Each conductive post 4 is made of at least two elements, namely an insulating element 5 and a conductive element 6. The conductive element 6 extends from a lower face 7 of the insulating element 5 facing the active surface 3 of chip 1 to an upper face 8 at the opposite end of the insulating element 5. Onto this upper face 8 of the insulating element 5, a conductive face-plate 9 may be located. As will be described in more detail in the following, the conductive face-plate 9 may be used as a support for an interconnect element such as a solder depot (e.g., solder bump or ball) to be applied to the conductive post 4, i.e. may serve as a "ball pad" or "landing pad" for such interconnect element. Typically, only one such interconnect element (i.e. for instance one solder ball or bump) is applied to each conductive post 4. Other types of interconnect elements different from solder depots are also possible. The conductive face-plate 9 may be made of the same material as the conductive element 6 or could be fabricated from a different conductive material.

The dimensions of the conductive posts 4 may vary over a wide range. Typically, the conductive posts 4 extend about at least 30 μm to about 100 μm or more from the active surface 3 of the chip 1. Typical heights may be 50 μm to 80 μm, but smaller or greater heights are equally possible.

The lateral dimensions of the conductive posts 4 may be in a range about 100 to 600 μm. Typically, the lateral dimensions may to some extent be governed by the diameter of a solder depot applied to the conductive face-plate 9 of the conductive post 4. For instance, if a solder bump (or ball) having a diameter of about 300 μm is used, the lateral dimension of the conductive post 4 may also be about 300 μm. Conductive posts 4 having larger maximum lateral dimensions of about 500 μm or 400 μm are also feasible. Further, especially when using solder bumps of smaller diameter, the lateral dimension of conductive posts 4 may also be smaller, e.g., less than 300 μm or even less than 250 or 200 μm. The lateral dimension of the conductive element 6 extending through a through-hole in the insulating element 5 may be about 100 μm in order to provide for a sufficient bulk conductivity through the conductive post 4. The lateral dimension of the face-plate 9 may be a little bit smaller (e.g., about 280 μm) than the lateral dimension of the conductive post 4 or may be the same, i.e. may also amount to about e.g., 300 μm.

In FIG. 1, the conductive element 6 extends through a through-hole of the insulating element 5 in a central region thereof. However, it is also possible that the insulating element 5 has a solid design, with the conductive element 6 extending along an outer surface of the insulating element 5.

Further, it is to be noted that in FIG. 1 the conductive element 6 is located spatially above a chip pad 2. As will be described in more detail further below, in most practical implementations, however, a redistribution layer (RDL) made of a conductive material such as metal will be arranged above the active surface 3 of the chip 1 in order to connect between the chip pads 2 and the conductive elements 6. A conductive RDL allows to freely choose the positions of the conductive posts 4 over the active surface 3 of the chip 1. This allows to comply with any desired (e.g., standardized) interconnect layout which has to be met by the package designer. As an example, FIG. 2 illustrates an interconnect layout in which the conductive posts 4 are distributed in a regular array across the active surface 3 of the chip 1.

Figure 2:
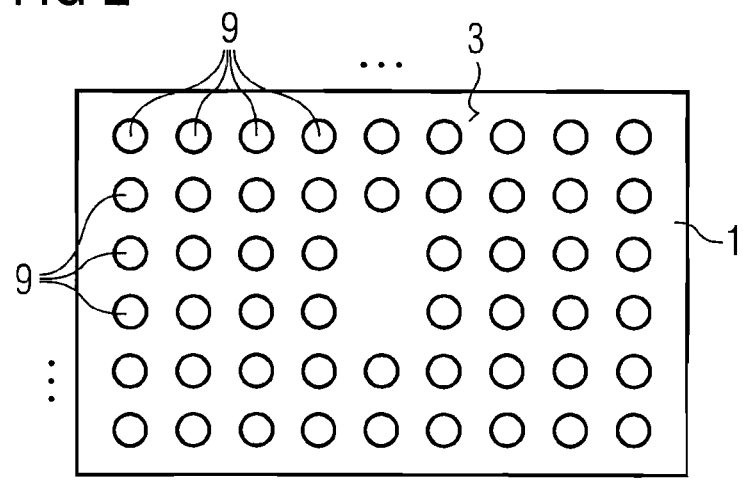
FIG. 2 illustrates a top view onto a surface equipped with conductive interconnect posts of the semiconductor substrate illustrated in FIG. 1.

Package designs as schematically illustrated in FIGS. 1 and 2 are termed "fan-in" type designs, because the entire package interconnect (i.e. the RDL (not illustrated) and the conductive posts 4) are located within the outline of the chip 1. FIGS. 3 and 4 schematically illustrate a "fan-out" type package providing for an enlarged package interconnect area.

More specifically, a fan-out type package may be established by a chip 1 embedded in a mold compound 10. The mold compound 10 covers the chip 1 at least in a lateral dimension and provides additional area available for the package interconnect. The mold compound 10 has a surface 11 which lies substantially flush with the active surface 3 of the chip 1. This surface 11 of the mold compound 10 may be used as a support for additional conductive posts 4 which are located outside and/or partially outside of the outline of chip 1.

Figure 3A:
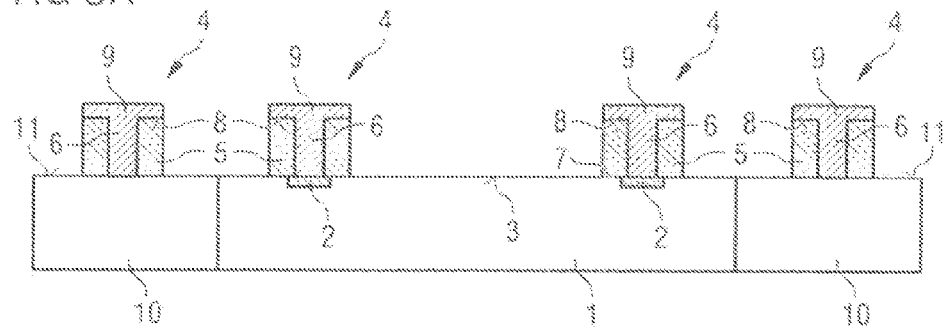
FIGS. 3A and 3B illustrate cross-sectional views of a semiconductor substrate embedded in a mold compound and including conductive interconnect posts.
Figure 3B:
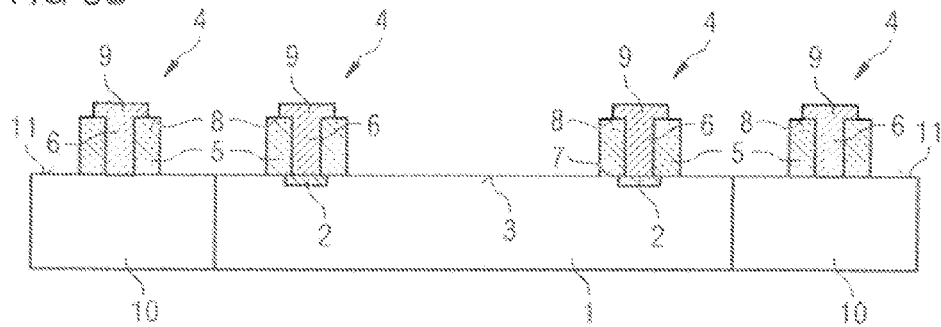
Figure 4:
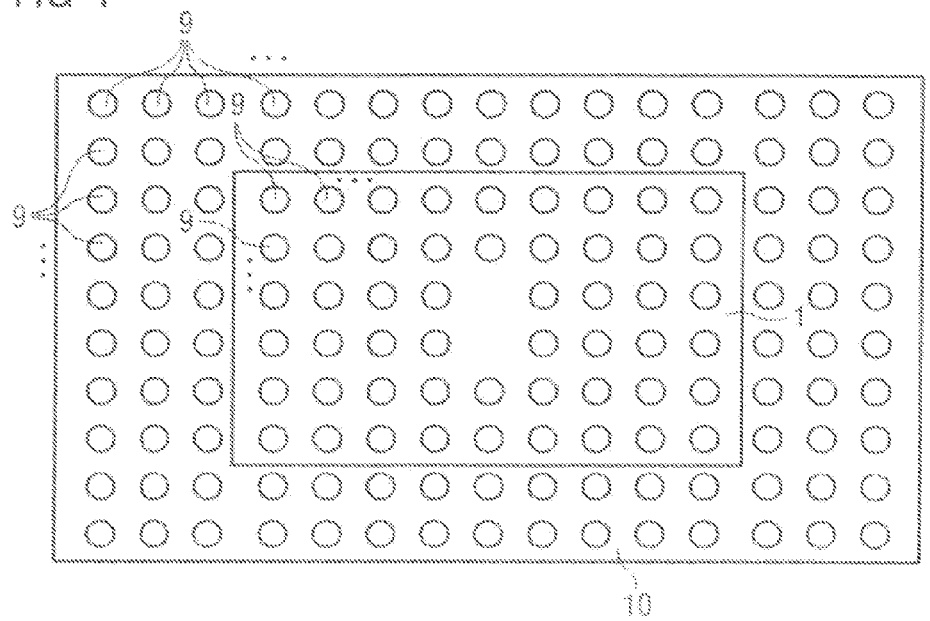
FIG. 4 illustrates a top view onto a surface of the semiconductor substrate and a surface of the mold compound embedding the semiconductor substrate as illustrated in FIG. 3A, wherein both surfaces are equipped with conductive interconnect posts.

Regarding FIGS. 3A and 3B, it is to be noted that any RDL or interconnect wiring between chip pads 2 and conductive posts 4 (especially those located beyond the chip boundary) is not illustrated in FIGS. 3A and 3B. As already mentioned in conjunction with FIG. 1, such RDL or package interconnect wiring will be explained in more detail further below, cf. FIGS. 5 and 9.

Comparing FIG. 4 with FIG. 2 reveals that fan-out type packages may provide for a significantly enhanced number of package conductive posts 4 at the same pitch. In practice, the pitch is often standardized and thus not allowed to shrink with chip miniaturization. Therefore, fan-out type packages are a cost efficient approach to reconcile chip miniaturization and package compatibility.

In fan-out type packages as illustrated in FIGS. 3 and 4, the conductive posts 4 may also be located exclusively on the mold compound surface 11. Further, it is apparent for a person skilled in the art that packages as depicted in FIGS. 1 to 4 may be used as ball grid array (BGA) type packages in case that solder bumps or balls are applied to the conductive posts 4. Further, although throughout FIGS. 1 to 4 (and also in the following figures) the conductive posts 4 are depicted to have a circular cross-section, i.e. are formed in a cylindrical column shape, other designs such as columns having rectangular cross-sections are feasible.

Figure 5:
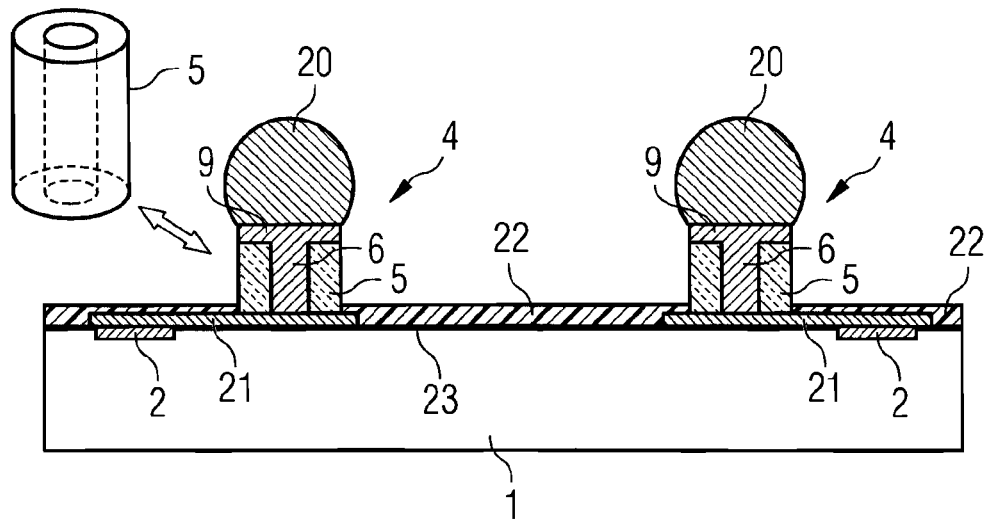
FIG. 5 illustrates a cross-section view of a semiconductor substrate equipped with conductive interconnect posts with solder bumps attached thereon.

FIG. 5 illustrates an embodiment of a semiconductor device which is configured substantially in line with the embodiment illustrated in FIG. 1. Same reference signs designate like parts throughout the drawings. FIG. 5 illustrates solder balls 20 applied to the face-plates 9 used as ball pads in this arrangement. Further, a conductive RDL 21 is used to relocate the conductive posts 4 in relation to the chip pads 2. The RDL 21 is insulated from the active surface 3 of the chip 1 by a hard passivation layer 23. An optional dielectric cover layer 22 may be arranged over the conductive RDL 21 to avoid exposure of the RDL 21. Again, as illustrated in the upper left part of FIG. 5, the insulating element 5 may be a hollow column structure.

The solder balls 20 may be of eutectic solder (Sn—Pb), which has an elastic modulus of about 20 GPa compared to about 44 GPa of lead-free solder based on Sn—Ag compounds. The lower the elastic modulus, the higher is the resilience of the solder ball. Thus, eutectic solder balls provide for a better ball crack resistance than lead-free solder bumps.

Further, the resilience of the package interconnect depends on the materials and dimensions chosen for the conductive posts 4. Both, the insulating element 5 and the conductive element 6 may be made of highly resilient polymeric materials. Further, the higher the conductive posts 4, the greater is the resilience of the post 4. As an example, if the chip 1 is made of silicon and the mounting platform on which the chip 1 is to be mounted is a PCB (i.e. made of epoxy resin), the conductive posts 4 and applied solder balls 20 have to absorb stress which is caused by the mismatch of the coefficient of thermal expansion (CTE) of the PCB substrate (about 15 ppm/° C.) and the CTE of silicon (about 3 ppm/° C.).

Figure 6:
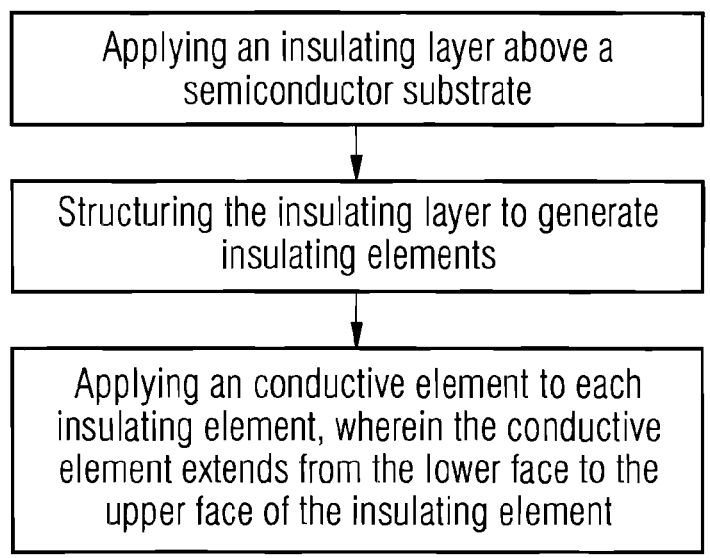
FIG. 6 illustrates a flow diagram showing basic manufacturing processes for fabricating a structure as illustrated in FIGS. 1 to 5.

A flow diagram showing basic manufacturing processes for fabricating a structure as illustrated in FIGS. 1 to 5 is illustrated in FIG. 6. First, an insulating layer is applied above the semiconductor substrate 1. Then, the insulating layer is structured to generate the insulating elements 5. A conductive element 6 is applied to each insulating element 5 such that the conductive element 6 extends from the lower face 7 to the upper face 8 of the insulating element.

Figure 7:
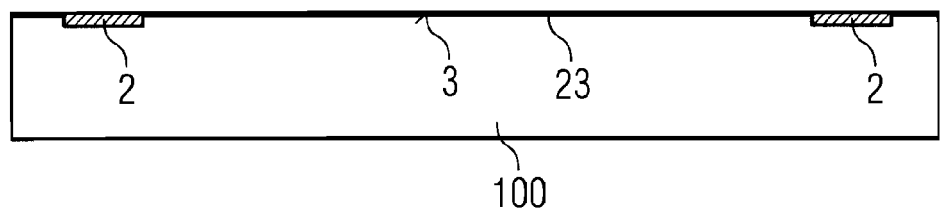
FIGS. 7 and 8 illustrate manufacturing processes for fabricating the structure illustrated in FIG. 5.
Figure 7:
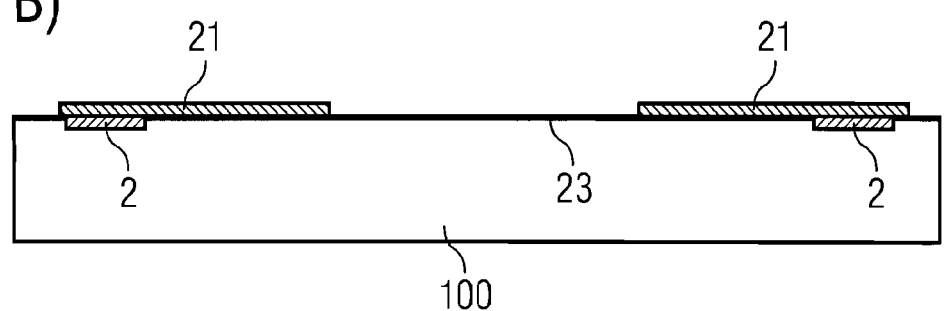
Figure 7:
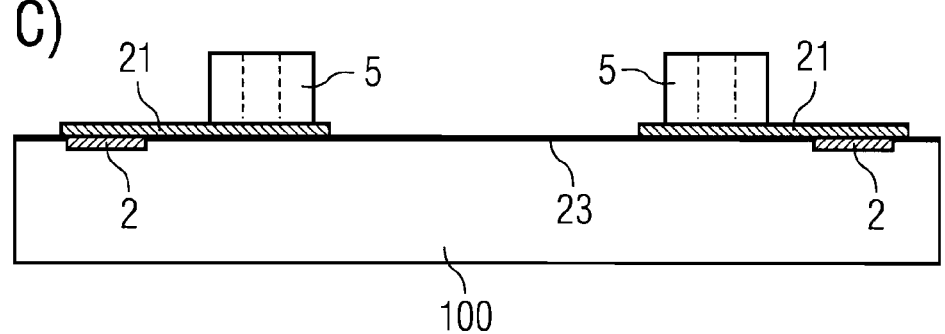
Figure 8:
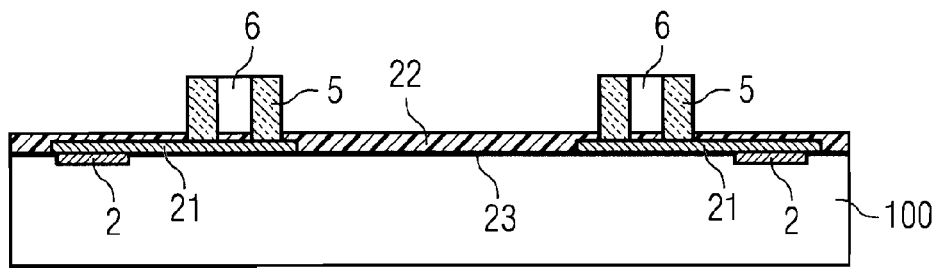
Figure 8:
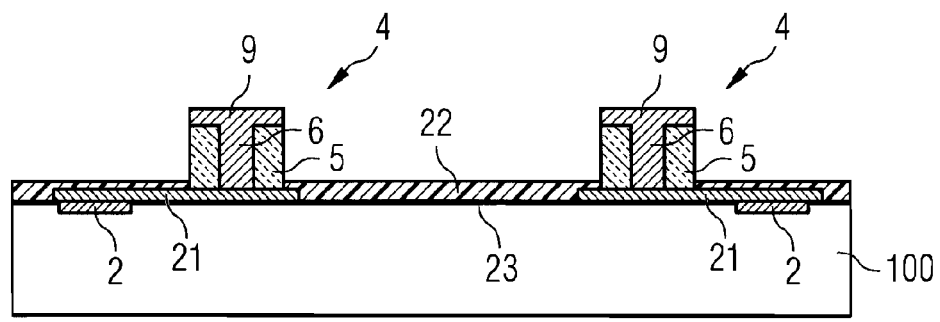
Figure 8:
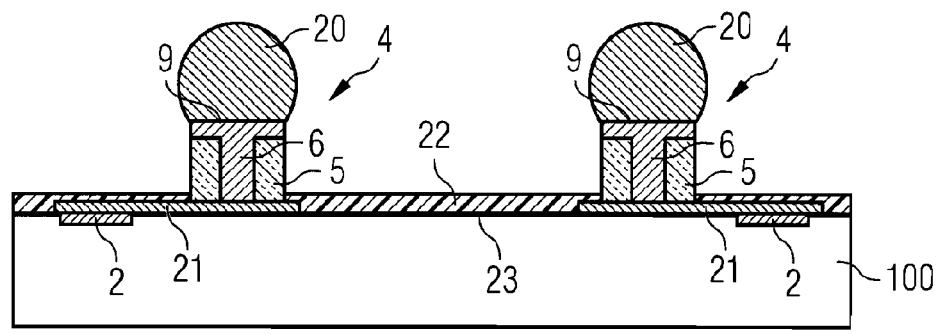

FIGS. 7 and 8 illustrate in more detail manufacturing processes A) to F) for fabricating the embodiment illustrated in FIG. 5. The starting point is a wafer 100 of which, in FIGS. 7 and 8, only a portion corresponding to a single chip 1 is depicted. Wafer 100 may be processed according to standard wafer level packaging (WLP) technology. Thus, all process processes performed before dicing the wafer 100 are accomplished on wafer level.

According to process A) pads 2 are generated on the wafer 100. Next, a hard passivation layer 23 is deposited on the active surface 3 of the wafer 100. The insulating hard passivation layer 23 may be made e.g., of silicon oxide or silicon nitride.

In process B) the conductive RDL 21 is applied above the active surface 3. The RDL 21 may be directly applied on the hard passivation layer 23. In this case, any dielectric layer between the hard passivation layer 23 and the RDL 21 is avoided. Thus, using the hard passivation layer 23 as insulator of the RDL, a cost efficient design of the package wiring is obtained. However, it is also possible to generate a thin film polymeric dielectric layer (not illustrated) either directly onto the active surface 3 of the wafer 100 (to replace the hard passivation layer 23) or onto the hard passivation layer 23 and then to apply the RDL 21 on this polymeric dielectric layer. Such polymeric dielectric layer, if present, may have a thickness of about 6 μm, and typically less then 10 μm.

In both cases, formation of the RDL 21 may be accomplished by a sputter and plate process. Sputter and plate processes are well-known in thin film technology. Briefly, a seed layer (for instance TiW) is applied on the hard passivation layer 23 (or, if present, the polymeric dielectric layer). Next, a photoresist layer is deposited on the seed layer and structured by photolithography to form trenches in the photoresist layer. Subsequently, electro-plating using e.g., copper may be used to fill these trenches in order to generate the conductive lines representing the RDL 21. Such RDL 21 may have a thickness of about 6 μm, and typically less then 10 μm.

In process C) the insulating elements 5 of the conductive posts 4 are generated. To this end, a dielectric resist material is deposited on the wafer 100. The deposition of the dielectric resist material may be accomplished by spin-coating of a liquid resist material or by laminating a pre-cured dry film resist material on the wafer 100. The thickness of the resist layer corresponds to the height of the insulating elements 5. A film thickness of more than 200 μm may be obtained within a single spin coat process. For instance, photoresist SU8 may be used as a resist material.

Then, the resist layer is structured to generate the insulating elements 5 having the shape of a hollow cylinder. Processes involved may be light exposure using a near UV (e.g., 350-400 nm) light source, post exposure bake (PEB), development and etching of the unexposed resist areas.

The center of the hollow insulating element 5 is placed on top of the RDL 21. The insulating elements 5 can be of different diameter and height and even the diameter of the hollow openings may be variable. Thus, the insulating elements 5 may have different elastic and electrical properties among each other.

Subsequently, as illustrated in process D), the dielectric cover layer 22 may be applied and the center openings of the insulating elements 5 are filled with a conductive material.

Various techniques may be used for filling the center openings of the insulating elements 5. The center openings may be filled by a liquid filling process. The wafer 100 is entered into a vacuum chamber and emerged into a bath of a liquid conductive material, e.g., solder. As a result of the vacuum, the liquid conductive material is drawn into the openings of the insulating elements 5. Then, the wafer 100 is put out of the solder bath. Solder within the openings keeps attached to the RDL 21 at the bottom of the openings and then solidifies within the opening. As liquid solder does not attach to polymeric materials such as the top and side walls of the insulating elements 5 and the polymeric cover layer 22, only the openings of the insulating elements 5 are filled with solder.

Alternatively, a printing process may be used to fill the openings of the insulating elements 5 with a conductive material. In a printing process, a screen or stencil is used to squeeze a conductive polymer into the openings of the insulating elements 5. Typically, such printable conductive polymers are filled with metal particles and additives to enhance conductivity of the material. More specifically, such conductive polymeric interconnect materials may e.g., be of a (solderable) polymer thick film type using a polymer thick film formulation of solder alloy, copper powder, epoxy resin and flux/hardener chemistry, or may be of a conductive ink type using a phenoxy resin system highly filled with silver flakes. Some of these conductive polymeric materials are directly solderable. Therefore, it is possible to also manufacture the conductive face-plate 9 from such conductive polymeric material, for instance by a subsequent printing process using a screen having holes with a larger diameter than the screen used for filling the openings of the insulating elements 5. The conductive polymeric material may have thixotropic properties and can be dried and cured after application.

As a further option, conductive polymeric material as described above may be applied into the openings of the insulating elements 5 by dispensing. Dispensing is accomplished by applying a defined volume of conductive polymeric material into the opening of each insulating element 5 via a capillary tool. Although dispensing is inherently a sequential (i.e. slow) process, a shower-head dispenser including of a plurality of capillaries may be used to accelerate the process.

Still a further process which can be used to fill the openings of the insulating elements 5 with a conductive polymeric material is ink-jetting. As already mentioned, conductive polymeric inks are available with a variety of different physical properties.

The openings in the insulating elements 5 may also be filled by a sputter and plate process as has been described above in conjunction with the formation of the RDL 21. Such process allows to provide the conductive post 4 with a conductive element 6 made of metal. As a considerable plating height has to be obtained, a sputter and plate process may be more costly than other processes mentioned above.

According to still another embodiment, filling the openings of the insulating elements 5 may be accomplished concurrently with solder ball apply. More specifically, such process may involve depositing a seed layer (e.g., made of palladium) on the inner side walls and the top faces 8 of the insulating elements 5. Then, copper is electroless grown on the seed layers. When solder balls 20 are applied to such insulating elements 5 coated with a copper layer at their top faces 8 and inner side walls, the solder material flows into the copper-coated openings and provides for the filling of the openings in order to ensure a sufficiently high bulk conductivity of the conductive posts 4. It is to be noted that this technique can equally be applied if the conductive element 6 is chosen to be circumferential to the insulating element 5, i.e. if the insulating element 5 is located at the center region of the conductive post 4 and the conductive element 6 is located at the peripheral region of the conductive post 4.

At process E), the conductive face-plates 9 are applied to the conductive posts 4 if needed. As described above, several techniques provide for the application of the conductive face-plates 9 in course of the process of filling the openings of the insulating elements 5.

In process F), solder balls (or bumps) 20 are applied to the conductive posts 4. Standard ball placement techniques may be used. After process F), the wafer 100 may be separated into single chips 1. It is also possible that chip singularization (so-called dicing) is performed at an earliest stage in the process flow of processes A) to F).

Due to the resilience of the conductive posts 4 and the elevated stand-off of the interconnect elements (e.g., the conductive face-plates 9 or the solder balls 20 or any other interconnect material such as e.g., a conductive adhesive etc.), high temperature cycle reliabilities can be obtained. Further, neither an underfill material applied between the solder balls 20 nor any additional solder stop material usually arranged adjacent to the face-plates 9 are needed. As the photoresist material may be patterned with a high aspect ratio and near vertical side walls, very small pitches down to less than 10 µm could principally be obtained. As mentioned above, the structure illustrated in FIG. 5 and process F) of FIG. 8 can be used as flip-chip package as well as WLB (wafer level ball grid array) package. It may be used for direct mounting on an application board such as a PCB or for mounting the chip 1 on an interposer which forms part of the chip package and is equipped with additional package interconnect means to be connected to an application board.

Figure 9:
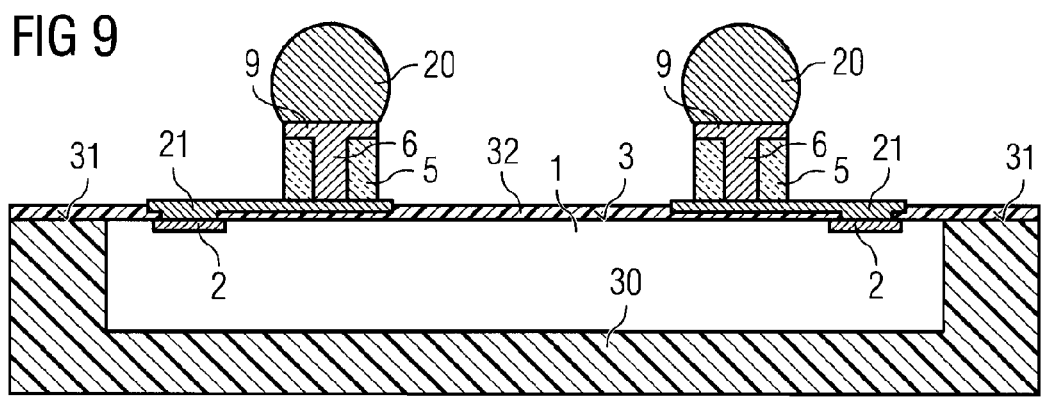
FIG. 9 illustrates a semiconductor substrate embedded in a mold compound and being equipped with conductive interconnect posts with solder bumps attached thereon.

FIG. 9 illustrates a fan-out type package having a chip 1, an RDL 21, conductive posts 4 and solder bumps 20. In contrast to the package illustrated in FIG. 5, chip 1 is embedded in a mold compound 30. Mold compound 30 covers the chip 1 laterally and at the back surface of the chip 1 opposed to the active surface 3. As has been described in conjunction with FIGS. 3 and 4, the mold compound 30 provides an additional upper surface 31 lying substantially flush with the active surface 3 for establishing additional conductive posts 4 (not illustrated in FIG. 9). Further, the package illustrated in FIG. 9 distinguishes from the package illustrated in FIG. 5 by a thin-film polymer layer 32 which may extend over the active surface 3 of chip 1 and the adjacent upper surface 31 of the mold compound 30. The RDL 21 is arranged on this polymer layer 32. It is to be noted that such polymer layer 32 may also be provided in the package illustrated in FIG. 5 and may optionally replace the hard passivation layer 23. In the package illustrated in FIG. 9, the polymer layer 32 may absorb any possible process at the transition between the surface 31 of the mold compound 30 and the active surface 3 of the chip 1. Further, it is to be noted that the lateral side wall of chip 1 representing its cutting edge is usually not coated by a hard passivation layer 23 and therefore may cause a risk of shorting an RDL 21 passing across the chip boundary to mold compound surface 31. Therefore, especially for fan-out type packages as illustrated in FIG. 9, the thin-film polymer layer 32 may improve insulating safety at the chip-to-mold compound boundary. Nevertheless, also for the fan-out type package illustrated in FIG. 9, it is possible to avoid the polymer layer 32 if appropriate measures are undertaken to guarantee insulation of the top cutting edge of the chip 1 from the RDL 21.

Figure 10:
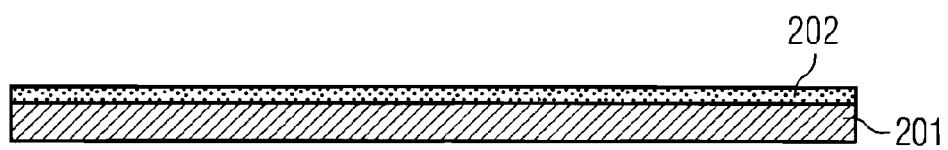
FIG. 10 illustrates manufacturing processes used for generating the structure illustrated in FIG. 9.
Figure 10:
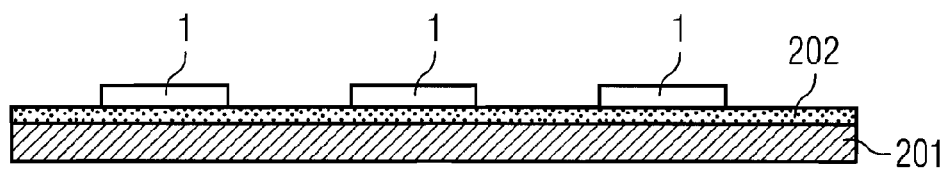
Figure 10:
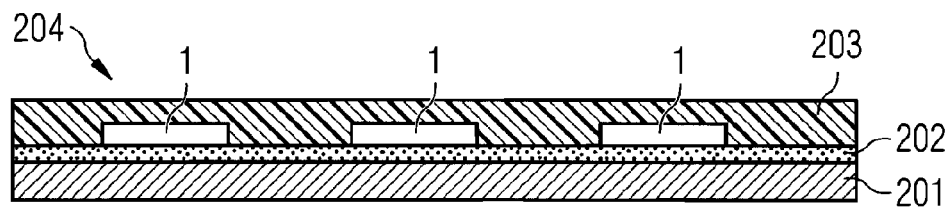
Figure 10:
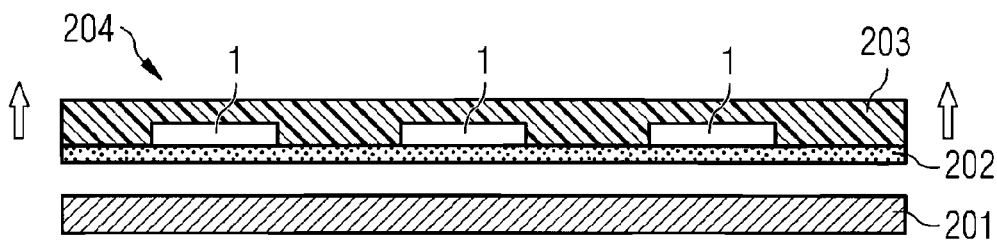
Figure 10:
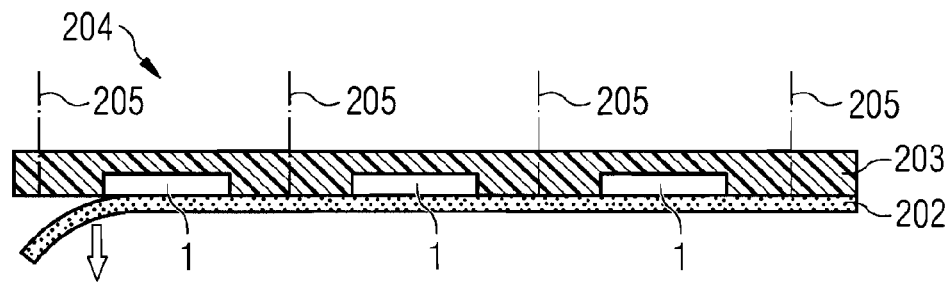

FIG. 10 depicts a process flow for manufacturing fan-out type mold compound packages as illustrated in FIGS. 3, 4 and 9.

A metal carrier 201 has a double sided adhesive tape 202 laminated on top thereon, cf. process A). In process B), chips 1 are placed in a spaced-apart relationship on the metal carrier 201 and fixed in place by the adhesive tape 202. Then, in process C), the metal carrier 201 with attached chips 1 is inserted into a mold press and the chips 1 are encapsulated with mold compound 203 to form a molded reconfigured wafer 204.

After post-mold curing, the adhesive tape 202 together with the molded reconfigured wafer 204 is released from the metal carrier 201 in process D).

In process E), the adhesive tape 202 is peeled off to yield the molded reconfigured wafer 204. Then, not illustrated in FIG. 10, the molded reconfigured wafer 204 is separated into single packages at partition lines 205. It should be noted that the plastic mold compound 203 should have a CTE close to the CTE of silicon (approximately 3 ppm/° C.). The CTE of the mold compound 203 may be controlled by the filler content. Good thermal expansion matching is achieved with a mold compound 203 having a filler content greater than 85%.

Figure 11:
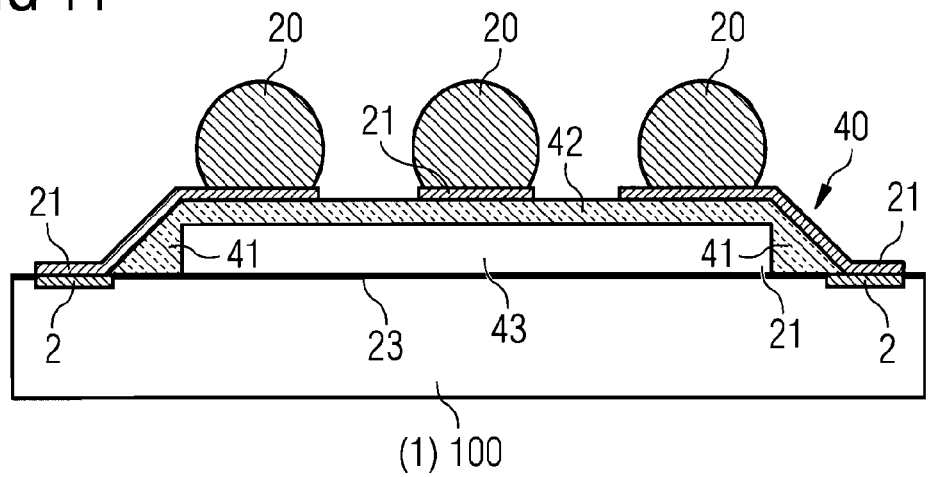
FIG. 11 illustrates a cross-sectional view of a semiconductor substrate equipped with a hollow support structure having solder bumps applied on top thereof.

FIG. 11 illustrates a further embodiment of a package having a chip interconnect structure with enhanced resilience. Here, instead of using a single conductive post 4 for each package interconnect element, a "flying dielectric" is used to avoid the interconnect elements (e.g., solder balls 20) to be placed directly in contact with the chip 1. More specifically, starting with a wafer 100 being processed according to process B) of FIG. 7, a hollow structure 40 having side walls 41 and a top plate 42 is established over the active surface 3 of the wafer 100 (FIG. 11 may also be interpreted to illustrate a portion of wafer 100 corresponding in size to the chip 1 used in the chip package later on). The side walls 41 and top plate 42 define a cavity 43 over the active surface 3 of chip 1, which again may be coated with a hard passivation layer 23.

An RDL 21 is connected to the chip pads 2 and extends along inclined or ramped side walls 41 to the upper side of the top plate 42 of the hollow structure 40. There, package interconnect elements such as solder balls 20 are attached to the RDL 21 and thus provide external terminals of the package illustrated in FIG. 11. The RDL 21 may be sputtered and plated, printed, jet-printed or dispensed or electroless plated. Dispensing allows for application of strongly inclined or nearly vertical parts of RDL 21, i.e. especially at the side wall portions of the hollow structure 40. Further, it is to be noted that the ramp shape used for the outer surface of the side walls 41 strongly facilitates any plating process, because plating at vertical elevations is difficult.

Figure 12:
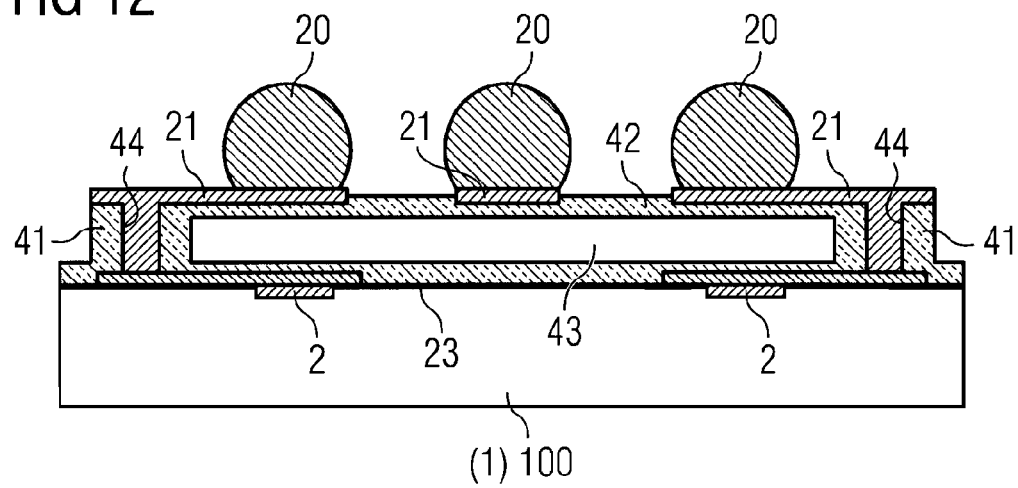
FIG. 12 illustrates a cross-sectional view of a semiconductor substrate equipped with another hollow support structure having solder bumps applied on top thereof.

FIG. 12 illustrates another embodiment of a package using a hollow structure 40 for supporting package interconnect elements (e.g., solder balls or bumps 20) at an elevated location over the active surface 3 of the chip 1. Most of the description in conjunction with FIG. 11 also applies to the embodiment illustrated in FIG. 12. However, the hollow structure 40 of FIG. 12 distinguishes from the hollow structure 40 of FIG. 11 in that the RDL 21 in FIG. 12 passes through vias or through-holes provided in the side walls 41 of the hollow structure 40 rather than along the outer surface of the side walls 41 as depicted in FIG. 11. Further, in FIG. 12, the chip pads 2 are located laterally under the hollow structure 40 rather than circumferential thereto as illustrated in FIG. 11. However, these possibilities are interchangeable and it is readily possible that in FIG. 11 (FIG. 12) the chip pads 2 are within (outside) the outline of the cavity 43, whereas in FIG. 12 (FIG. 11), the chip pads 2 may be located outside (within) the outline of the cavity 43.

As illustrated in FIGS. 11 and 11, all interconnect elements (e.g., solder balls or bumps 20) of the chip package may be located on the top plate 42 of a single hollow structure 40 provided on the chip 1. However, it is also possible that a plurality of hollow structures 40 are arranged over the active surface 3 of the chip 1 and that each such hollow structure 40 supports a plurality of interconnect elements 20. In the first case, the lateral dimensions of the hollow structure 40 may substantially correspond to the lateral chip dimensions, i.e. the hollow structure 40 may cover a predominant part or substantially the whole area of the chip's active surface 3, whereas in the second case, the lateral dimensions of each hollow structure 40 are significantly smaller (and may e.g., be about ½, ⅓, ¼ etc.) of the lateral dimensions of the chip 1.

Further, although FIGS. 11 and 12 only exemplify fan-in packages, analogously to FIGS. 3, 4 and 9, fan-out type packages using a hollow structure 40 supporting the interconnect elements 20 are equally possible and may have the same features and benefits as explained before. Especially, the footprint of the hollow structure 40 may be significantly enlarged such that the side walls 41 of the hollow structure 40 are established partly or completely above the mold compound surface 31.

The height of the top plate 42 over the active surface 3 of the chip 1 may have the same values as indicated before in view of the height of the conductive post 5. Further, it is to be noted that the stand-off of the interconnect elements 20 achieved by the hollow structure 40 provides for an appropriate resilience between the interconnect element 20 and the chip 1 in the same way as described before in conjunction with the embodiments illustrated in FIGS. 1 to 9.

Further, as the cavity 43 forms an air gap between chip 1 and the RDL 21, cross talk or interference between internal functional elements of the chip 1 such as transistors and the interconnect wiring of the package (e.g., RDL 21 and optional passive elements such as capacitors, resistors or inductors implemented on the top plate 42 of the hollow structure 40) is very small if compared to arrangements in which the interconnect elements 20 are elevated over the chip surface by a polymeric spacer layer (the dielectric constant of air is 1 and thus considerably lower than the dielectric constant of polymeric spacer materials lying at best in the range of about 2.5 to 3.5).

Figure 13:
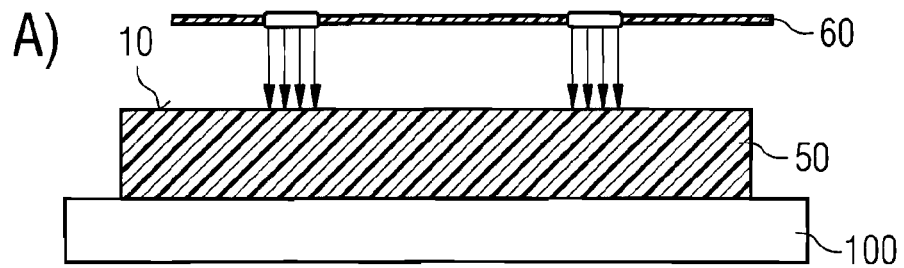
FIG. 13 illustrates manufacturing processes for producing a hollow support structure as illustrated in FIGS. 11 and 12.
Figure 13:
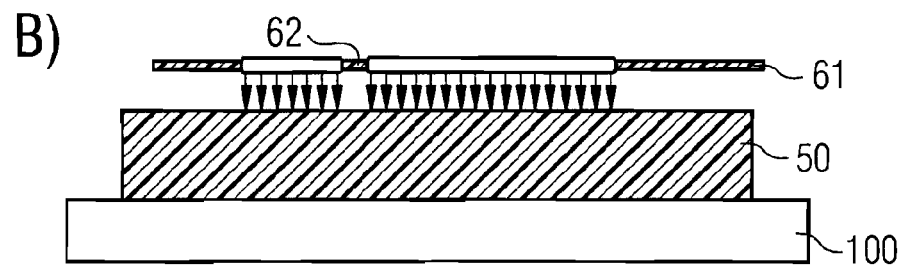
Figure 13:
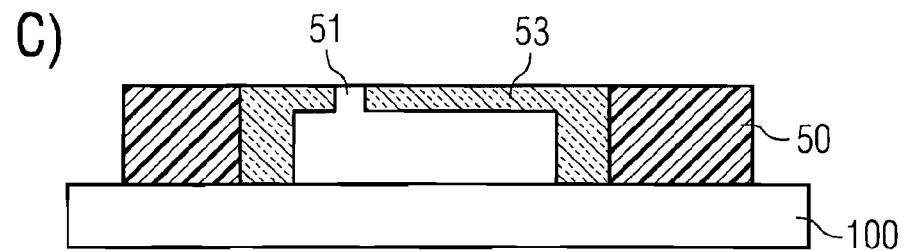
Figure 13:
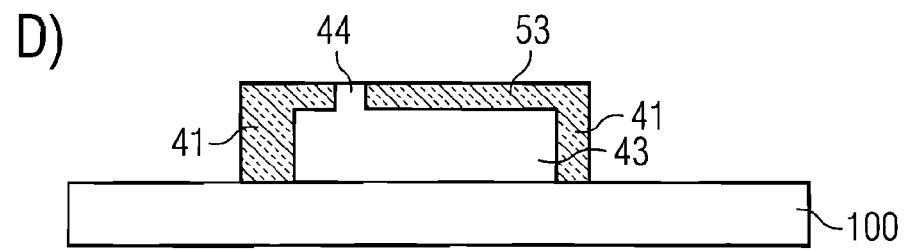
Figure 13:
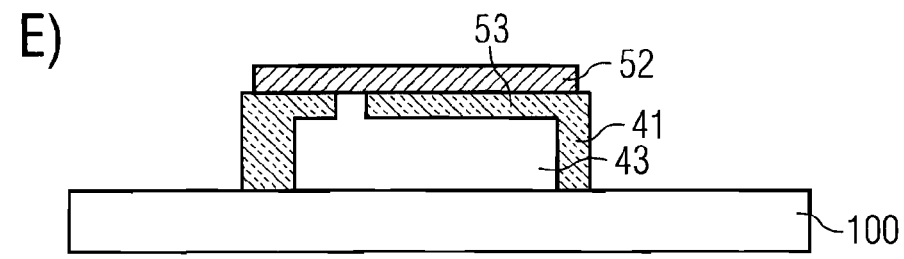

FIG. 13 illustrates by way of example processes A) to E) for manufacturing a polymeric hollow structure 40. The processes may be performed on the wafer 100, i.e. prior to chip singularization. Of course, it is also possible to perform these processes on separate chips 1.

As a starting point, a thick polymer layer 50, e.g., made of SU8, is deposited over wafer 100. A first photo-mask 60 is used to expose such portions of the polymer layer 50 to light which are intended to form the side walls 41 of the hollow structures 40, cf. process A).

Next, a second photo-mask 61 is used to expose portions 53 of the polymer layer 50 which are intended to form part of the top plate 42 of the hollow structure 40, cf. process B). A small mask portion 62 is used to avoid light exposure of the polymer layer 50 at a location where an opening 51 is intended to be formed in top plate portion 53.

Projecting the images of the photo-masks 60, 61 onto the polymer layer 50 causes the polymer layer 50 (photoresist) to undergo a light-sensitive chemical reaction which causes the regions exposed to the light to be less susceptible to an etch process performed later on. At process C), the regions which are resistant to etching are illustrated. It is to be noted that the depth of such regions can be controlled e.g., by the intensity, exposure duration or the wavelength of the light used for exposure. For instance, exposure light used in process A) may have a shorter wavelength and/or a higher intensity than exposure light used in process B). Side walls 41 with an inclined outer wall surface as illustrated in FIG. 11 may be fabricated by using a grey scale gradient in the first photo-mask 60.

In process D), the photoresist polymer layer 50 is then "developed" by exposing it to an etch (e.g., chemical etch or plasma etch), which removes the unexposed photoresist. This process may be assisted by application of ultra-sonic energy. This way, the cavity 43 is generated. The removal of the photoresist polymer material within the hollow structure 40 is accomplished through the opening 51. In most cases, a plurality of openings 51 is provided in the top plate portion 53.

The opening 51 may then be closed by using another polymer layer 52 deposited on the structure as illustrated in FIG. 13, process D). Top plate portion 53 and polymer layer 52 represent top plate 42 as depicted in FIGS. 11 and 12. Thus, the upper surface of the polymer layer 52 corresponds to the upper surface of the top plate 42 and forms the base for RDL 21 deposition.

It is to be noted that the manufacturing process illustrated in FIG. 13 may be performed either by using a chip 1 or a wafer 100 or a reconfigured or "artificial" wafer 204 as illustrated in FIG. 10. In other words, as already indicated before, the hollow structure 40 as depicted in FIGS. 11 and 12 may equally be used for a fan-out type package. In this case, however, as chip pads 2 are located above the chip 1, i.e. within the outline of the chip boundary, an RDL 21 passing over the chip-to-mold compound boundary will be used to route the package wiring to the side walls 41 of the hollow structure 40.

Referring to the embodiment illustrated in FIGS. 11 to 13, the air gap 43 leads to the avoidance of any contact between the dielectric supporting the interconnect elements 20 (i.e. the top plate 42) and the active surface 3 of the chip 1. This increases the reliability of the package and results in high customer acceptance because the outer appearance of the package is very similar to the outer appearance of a conventional WLB.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A semiconductor device comprising:
a semiconductor substrate;
a mold compound embedding the semiconductor substrate;
at least two insulating elements, with at least a first insulating element located above the semiconductor substrate inside a lateral outline of the semiconductor substrate and at least a second insulating element located above the mold compound outside the lateral outline of the semiconductor substrate, the first insulating element having a first face facing the semiconductor substrate and a second face facing away from the semiconductor substrate and the second insulating element having a first face facing the mold compound and a second face facing away from the mold compound, the at least two insulating elements being spaced apart from each other in a lateral dimension of the semiconductor substrate; and a conductive element assigned to each of the at least two insulating elements, the conductive elements extending from the first face of the at least first and second insulating elements to the second face of the at least first and second insulating elements.

2. The semiconductor device of claim 1, comprising wherein only one conductive element is assigned to each of the at least two insulating elements.

3. The semiconductor device of claim 1, comprising wherein the conductive elements are electrically connected to the semiconductor substrate.

4. The semiconductor device of claim 1, comprising wherein the at least two insulating elements are hollow structures filled with the conductive element.

5. The semiconductor device of claim 1, comprising wherein the at least two insulating elements have a height of at least 30 μm.

6. The semiconductor device of claim 1, comprising wherein the at least two insulating elements have a maximum width smaller than 500 μm.

7. The semiconductor device of claim 1, comprising wherein the at least two insulating elements are made of a photoresist.

8. The semiconductor device of claim 1, comprising wherein the second face of the at least two insulating elements is coated with a conductive support layer.

9. The semiconductor device of claim 1, further comprising:
a solder depot located above the second face of the at least two insulating elements.

10. The semiconductor device of claim 1, comprising wherein the at least two conductive elements are a metal.

11. The semiconductor device of claim 10, comprising wherein the at least two conductive elements are a solder.

12. The semiconductor device of claim 1, comprising wherein the at least two conductive elements are a conductive polymer.

13. The semiconductor device of claim 12, comprising wherein the at least two conductive elements are a solderable conductive polymer.

14. The semiconductor device of claim 1, comprising wherein the at least two conductive elements are a conductive ink material.

15. The semiconductor device of claim 1, further comprising:
a hard passivation layer applied on the semiconductor substrate; and
a metal redistribution layer arranged directly on the hard passivation layer.

16. The semiconductor device of claim 8, comprising wherein the conductive support layer has a maximum width which is greater than a maximum width of the conductive elements.

17. The semiconductor device of claim 1, wherein the semiconductor substrate is configured to support the first insulating element and the mold compound is configured to support the second insulating element.

* * * * *